(12) United States Patent
Minamihaba et al.

(10) Patent No.: US 8,480,915 B2
(45) Date of Patent: Jul. 9, 2013

(54) METHOD OF MANUFACTURING SEMICONDUCTOR DEVICE

(75) Inventors: Gaku Minamihaba, Yokohoma (JP); Yukiteru Matsui, Yokohoma (JP)

(73) Assignee: Kabushiki Kaisha Toshiba, Tokyo (JP)

(*) Notice: Subject to any disclaimer, the term of this patent is extended or adjusted under 35 U.S.C. 154(b) by 109 days.

(21) Appl. No.: 13/236,229

(22) Filed: Sep. 19, 2011

(65) Prior Publication Data

US 2012/0258597 A1  Oct. 11, 2012

(30) Foreign Application Priority Data

Apr. 7, 2011  (JP) .................................. 2011-085443

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC ............................................ 216/89; 438/693

(58) Field of Classification Search
USPC ............................................. 216/89; 438/693
See application file for complete search history.

(56) References Cited

U.S. PATENT DOCUMENTS

2006/0019580 A1* 1/2006 Fahnle et al. .................... 451/36
2008/0227297 A1* 9/2008 Matsui et al. .................. 438/693

FOREIGN PATENT DOCUMENTS

JP  2000-204353  7/2000
JP  2008-235357  10/2008

* cited by examiner

*Primary Examiner* — Roberts Culbert
(74) *Attorney, Agent, or Firm* — Finnegan, Henderson, Farabow, Garrett & Dunner, LLP

(57) ABSTRACT

According to one embodiment, the method of manufacturing a semiconductor device includes contacting a film formed on a semiconductor substrate with a rotating polishing pad which is supported on a turntable, and feeding polishing foam to a region of the polishing pad with which the film is contacted, thereby polishing the film. The polishing foam is obtained by turning the aqueous dispersion into a foamy body. The aqueous dispersion includes 0.01-20% by mass of abrasive grain and 0.01-1% by mass of foam forming and retaining agent, all based on a total mass of the aqueous dispersion.

18 Claims, 4 Drawing Sheets

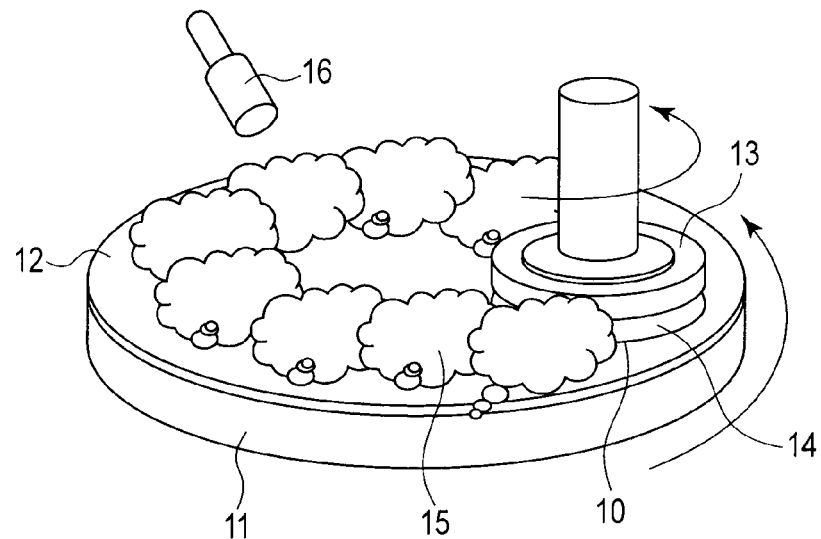
F I G. 1
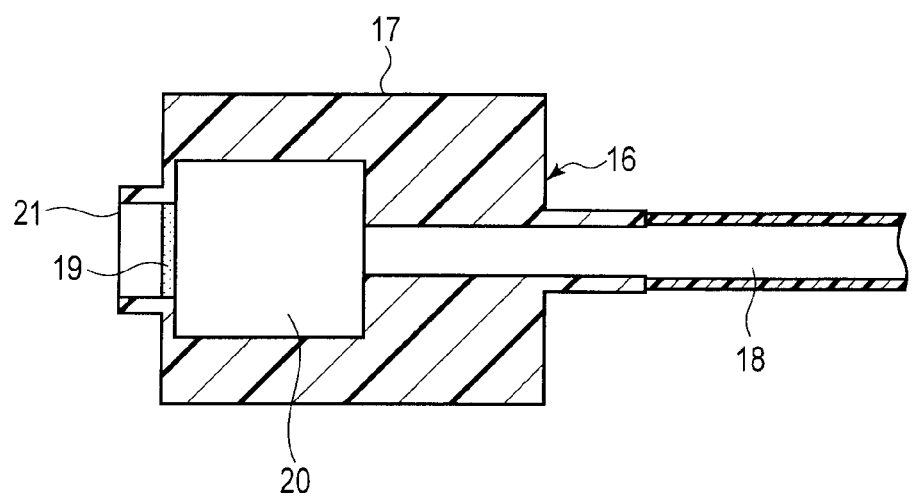
F I G. 2

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2011-085443, filed Apr. 7, 2011, the entire contents of which are incorporated herein by reference.

FIELD

Embodiments described herein relate generally to a method of manufacturing a semiconductor device.

BACKGROUND

In the manufacture of a semiconductor device, there has been practiced to polish a film deposited on the semiconductor substrate by chemical mechanical polishing (CMP) using a CMP slurry. The CMP slurry that has been conventionally employed is formed of, for example, a dispersion containing abrasive grain wherein pure water is employed as a dispersion medium. When CMP, a CMP slurry is fed in the vicinity of central portion of a rotating polishing pad. The CMP slurry thus fed spreads to the outer peripheral region of the polishing pad by centrifugal force, thereby the CMP slurry is utilized for the polishing of a film which is being contacted with the polishing pad.

All of the CMP slurry that has been fed to the polishing pad is not necessarily contribute to the polishing of the film to be polished. Since the CMP slurry is low in viscosity and part of the CMP slurry is discharge outside the polishing pad, the CMP slurry employed in the prior art is not utilized effectively.

If it is possible to retain the CMP slurry on the polishing pad without being discharged from the polishing pad, the quantity of CMP slurry to be used can be reduced, thus leading to the improvement of utilization efficiency of the CMP slurry.

BRIEF DESCRIPTION OF THE DRAWINGS

FIG. 1 is a perspective view schematically illustrating a method of manufacturing a semiconductor device according to one embodiment;

FIG. 2 is a cross-sectional view schematically illustrating the construction of a polishing foam generator;

DETAILED DESCRIPTION

Figure 3:
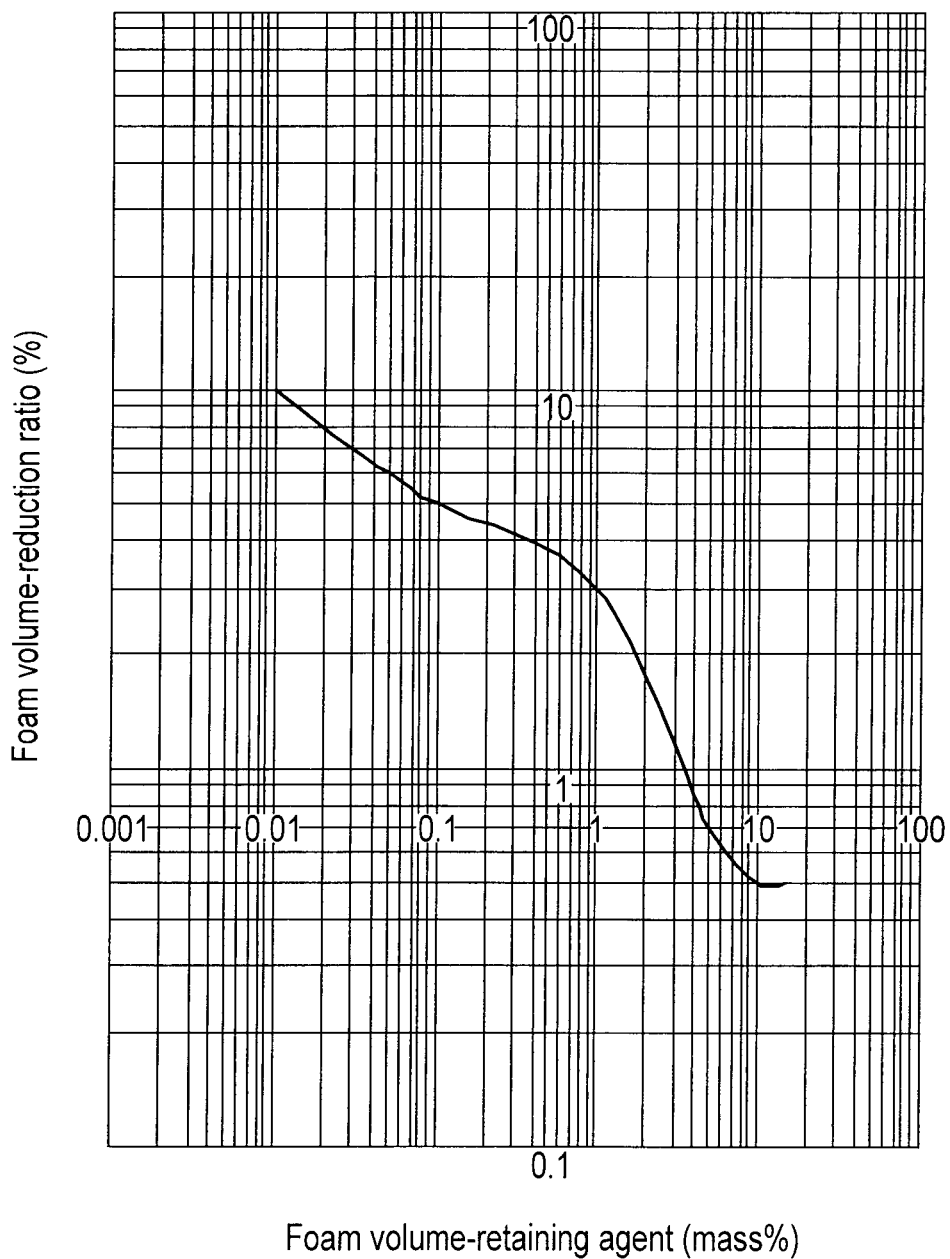
FIG. 3 is a graph illustrating the relationship between the content of a foam forming and retaining agent and a foam volume reduction ratio.

In general, according to one embodiment, the method of manufacturing a semiconductor device includes contacting a film formed on the semiconductor substrate with a rotating polishing pad which is supported on a turntable; and feeding polishing foam to a region of the polishing pad with which the film is contacted, thereby polishing the film. The polishing foam can be obtained by turning the aqueous dispersion into a foamy body. The aqueous dispersion includes 0.01-20% by mass of abrasive grain and 0.01-1% by mass of foam forming and retaining agent, all based on a total amount of the aqueous dispersion.

Next, embodiments will be explained with reference to drawings.

A method of manufacturing a semiconductor according to one embodiment will be explained with reference to FIG. 1. As shown in FIG. 1, a semiconductor substrate 14 which is held on a polishing head 13 to be driven by a rotating mechanism (not shown) is contacted with a polishing pad 12 supported on a turntable 11 to be driven by another rotating mechanism (not shown). By feeding polishing foam 15 to a prescribed region of the polishing pad 12 while rotating the turntable 11 and the polishing head 13, respectively at a prescribed rotating speed, the film 10 deposited on the semiconductor substrate 14 can be polished.

The region of polishing pad 12 to which the polishing foam 15 is fed among the entire surface of the polishing pad 12 is confined to a region with which the semiconductor substrate 14 is contacted. Since the polishing pad 12 is rotated, it can be said that the region of the polishing pad 12 to which the polishing foam 15 is fed is confined to the region corresponding to the orbital tract of the semiconductor substrate 14 moving on the polishing pad 12. The polishing foam 15 that has been fed to the polishing pad 12 enters into an interface between the polishing pad 12 and the film 10 to be polished, thereby polishing the film 10.

The polishing foam 15 utilized in the polishing of the film 10 to be polished can be prepared by turning an aqueous dispersion containing abrasive grain and a foam forming and retaining agent into a foamy body using a polishing foam generator 16.

The abrasive grain contained in the aqueous dispersion may be optionally selected depending on the material of the film to be polished. For example, if an oxide film such as a thermal oxide film is polished, it is possible to employ cerium oxide, silicon oxide, etc. The content of the abrasive grain in the aqueous dispersion is 0.01-20% by mass based on the total amount of the aqueous dispersion. When the content of the abrasive grain is less than 0.01% by mass, it would be impossible to achieve a practical polishing rate. On the other hand, if the content of the abrasive grain is more than 20% by mass, it would be no longer possible to retain a desired volume of polishing foam and the manufacturing cost would be increased. Preferably, the content of the abrasive grain in the aqueous dispersion is around 0.1-10% by mass based on the total amount of the aqueous dispersion.

An average particle diameter of the abrasive grain is generally around 10-1,000 nm. The average particle diameter of the abrasive grain can be determined, for example, by measuring the individual image of each of abrasive grains which have been obtained by a transmission electron microscope or by measuring the specific surface area that has been obtained by BET method using an automatic fluid type specific surface area-measuring apparatus.

The foam forming and retaining agent makes it possible to turn an aqueous dispersion into a foamy body by passing the aqueous dispersion through a polishing foam generator provided with a mesh and also makes it possible to retain the state of foamy body thus formed. However, it is necessary to prevent the foam forming and retaining agent from giving any adverse effects to the polishing of a film to be polished. Therefore, the foam forming and retaining agent is selected taking above affairs into consideration. When an oxide film is polished, it is possible to employ an anionic surfactant for example as a foam forming and retaining agent. It is also possible to employ ordinary sodium dodecyl sulfate (SDS) as a foam forming and retaining agent. It is especially preferable to employ, as a foam forming and retaining agent, alkyl benzene sulfonate and salts of alkyl benzene sulfonate. Among the alkyl benzene sulfonate, it is preferable to employ those having alkyl group of 8 to 16 carbon atoms. In order to enable the polishing foam to retain its volume while the influence thereof on the polishing speed of the film to be polished is taken into consideration, it is more preferable to employ those having alkyl group of 10 to 14 carbon atoms. In viewpoint of biodegradation, the alkyl group of alkyl benzene sulfonate is preferably of straight chain. As the salts, potassium salt and ammonium are preferable.

Specific examples of alkyl benzene sulfonate and salts of alkyl benzene sulfonate include linear dodecylbenzenesulfonic acid, potassium linear dodecylbenzenesulfonate, ammonium linear dodecylbenzenesulfonate, etc.

The content of the foam forming and retaining agent in the aqueous dispersion is 0.1-10% by mass. If the content of the foam forming and retaining agent is less than 0.1% by mass, it would be impossible to sufficiently secure the effects of enhancing the polishing speed even though a certain degree of enhancement can be obtained. Additionally, it would be impossible to create a desired state of foam. On the other hand, if the content of the foam forming and retaining agent is more than 10% by mass, the foam may adhere onto the film to be polished, thereby undesirably decreasing the polishing speed. Incidentally, by the expression of "a desired state of foam", it is intended to indicate a state wherein the volume reduction ratio of foam is 5% or less as the foam is kept standing for 120 seconds at room temperature. It is more preferable that the volume reduction ratio of foam is 1% or less as the foam is kept standing for 120 seconds at room temperature. When the content of foam forming and retaining agent in the aqueous dispersion is around 0.5-5% by mass, the aforementioned low volume reduction ratio of foam can be achieved. Details regarding the volume reduction ratio of foam and the formation of foam will be discussed hereinafter.

Depending on circumstances, resinous particle having a nonionic functional group on its surface may be co-used. Although this nonionic functional group in itself is incapable of acting as a foam-generating agent, it is possible to derive the effects of suppressing the volume reduction of polishing foam as it is co-used together with the aforementioned foam forming and retaining agent. In this case, it is possible to reduce the content required of the foam forming and retaining agent. Specific materials of the resinous particle can be selected from, for example, polystyrene, polymethacrylate, etc. Examples of the nonionic functional group include, for example, carboxyl group, sulfonyl group, etc.

The resinous particle having a nonionic functional group on its surface can be obtained according to the preparation method described, for example, in Example 4 of JP-A 2000-204353 (KOKAI).

The aqueous dispersion can be obtained by adding a predetermined quantity of abrasive grain and of foam forming and retaining agent to water. As for the water, it is possible to employ pure water, for example.

The aqueous dispersion thus prepared contains a foam forming and retaining agent and abrasive grain and can be turned into a foamy body by passing it through a polishing foam generator. The polishing foam generator 16 is constructed, for example, as shown in FIG. 2. A mixing chamber 20 is provided inside a cylindrical resinous cylinder block 17 and communicated with a feeding passageway 18. The aqueous dispersion containing a foam forming and retaining agent and abrasive grain can be fed, via the feeding passageway 18, into the mixing chamber 20 and accommodated therein.

By supplying air from the feeding passageway 18 to the interior of the mixing chamber 20, the aqueous dispersion is agitated and then allowed to pass through a mesh 19, thereby enabling the aqueous dispersion to turn into a polishing foam. The polishing foam is then discharged from a discharge opening 21 of the polishing foam generator 16. With respect to the aperture of mesh 19, as long as it is around 100-500 meshes, it is possible to create a desired state of foam. With respect to the materials of mesh 19, there is not any particular limitation and hence the mesh 19 may be formed of nylon, polyester, polyethylene, etc.

The supply flow rate of air can be regulated by an electropneumatic regulator. By blowing air into the aqueous dispersion containing prescribed quantities of a foam forming and retaining agent and abrasive grain under appropriate conditions, a foamy body can be obtained in a desired state. In order to obtain a foamy body in a desired state, the temperature of the aqueous dispersion is preferably within the range of 18-30° C. The air is desirably supplied in such a manner that the volume of air becomes 2-10 times larger than the volume of the aqueous dispersion. Further, it is also effective, in order to obtain foam of desirable state, to supply air through a filter so as to minimize the impurities in the air.

The polishing foam created in this manner by the polishing foam generator is featured in that the volume reduction ratio after 120 seconds is 5% or less. It is more preferable that the volume reduction ratio after 120 seconds is 1% or less.

The volume reduction ratio can be defined as follows. First of all, by the aforementioned polishing foam generator, an aqueous dispersion is turned into a foamy body, which is then accommodated in a graduated cylinder to determine the initial volume ($V_0$) of the foamy body. The foamy body thus determined is left standing for 120 seconds under the conditions of windless atmosphere and room temperature and then the volume ($V_{120}$) after 120 seconds is measured. Thus, volume reduction ratio of the foamy body can be obtained from $\{100 \times (V_0 - V_{120})/V_0\}$.

In the ordinary polishing process, the time required for polishing the film to be polished and being deposited on the semiconductor substrate is 120 seconds or less. As long as the polishing foam obtained as a foamy body from an aqueous dispersion can be kept in a desirable state, the polishing foam stays on the polishing pad, thus contributing to the polishing of the film to be polished. Since the polishing foam is reliably utilized for the polishing of the film to be polished, it is possible to secure a practical polishing speed. Moreover, the polishing foam applied to the polishing pad can be prevented from being discharged from the polishing pad even if the polishing foam is subjected to a centrifugal force (the rotational speed of the turntable is 10-150 rpm in general), thus making it possible to enhance the utilization efficiency of the polishing foam.

The state of the polishing foam can be assessed by the value of foam volume reduction ratio. It has been found out by the present inventors that as long as the foam volume reduction ratio after 120 seconds is 5% or less, it is possible to obtain desired effects of polishing foam.

EXAMPLES

Next, specific examples of the method of manufacturing a semiconductor device will be explained.

Embodiment 1

Abrasive grain was added to a dispersion medium to obtain an aqueous dispersion containing 0.5% by mass of the abrasive grain. Cerium oxide having an average particle diameter of 0.1 μm was employed as the abrasive grain and pure water was employed as a dispersion medium. The aqueous dispersion thus obtained was employed as Sample 1. This Sample 1 corresponds to a CMP slurry which has been conventionally used.

To this Sample 1 was added predetermined quantities of potassium linear dodecylbenzenesulfonate as a foam forming and retaining agent to obtain Samples 2-8. The amount of potassium linear dodecylbenzenesulfonate were regulated so that these samples could be formed respectively as polishing foam and that the foam volume reduction ratio thereof after standing for 120 seconds at room temperature would be confined respectively to a predetermined value. In order to create the polishing foam, a polishing foam generator constructed as shown in FIG. 2 was employed. The capacity of the mixing chamber 20 was around 50 cc and a 300-mesh polyethylene mesh was employed as the mesh 19. The diameter of the discharge opening 21 was about 5 mm. Air was supplied controlling the original pressure thereof to 0.5 MPa by an electropneumatic regulator.

The foam volume reduction ratio and the content of each of the foam forming and retaining agents are summarized in the following Table 1. Further, the relationship between the content of foam forming and retaining agent and the foam volume reduction ratio was plotted as shown in the graph of FIG. 3.

TABLE 1

| Sample No. | Foam volume-reduction ratio (%) | Foam forming and retaining agent (mass %) |
|---|---|---|
| 2 | 10 | 0.01 |
| 3 | 6 | 0.05 |
| 4 | 5 | 0.1 |
| 5 | 3 | 1 |
| 6 | 0.7 | 5 |
| 7 | 0.5 | 10 |
| 8 | 0.5 | 15 |

Further, a sample exhibiting a volume reduction ratio of 0.5% was obtained as Sample 9. This sample 9 contained resinous grain having a nonionic surface functional group. The content of the resinous grain in the Sample 9 was about 0.1% by mass. This surface functional group was carboxyl group and the resinous grain was about 50 nm in average particle diameter and formed of styrene/methacryl copolymer.

Figure 4:
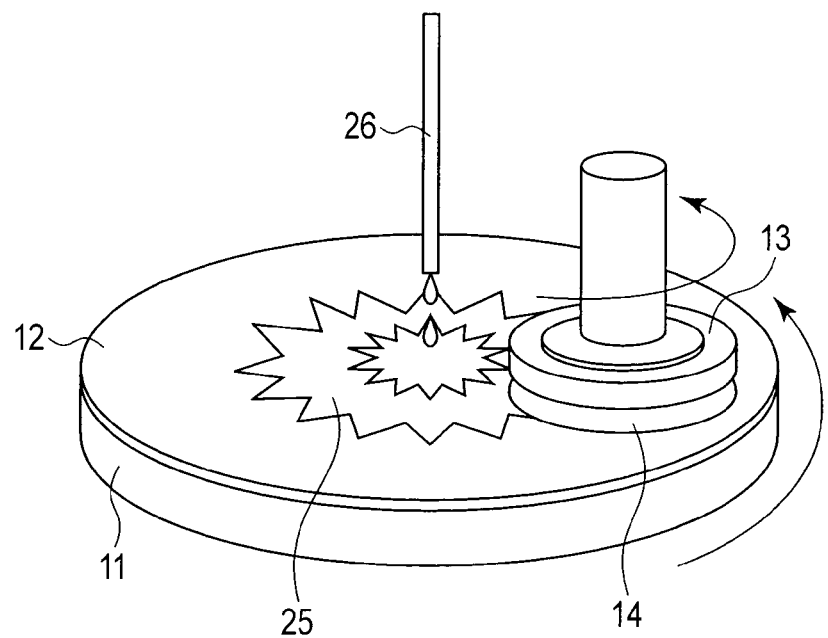
FIG. 4 is a perspective view schematically illustrating a method of manufacturing a semiconductor device according to the prior art.

Using Sample 1, a thermal oxide film deposited on the semiconductor substrate was polished. This thermal oxide film was 300 nm in thickness and the diameter of the semiconductor substrate was 200 mm. When polishing the thermal oxide film, the polishing head 13 holding the semiconductor substrate 14 was forced to contact with the polishing pad 12 at a polishing load of 300 hPa while driving the turntable 11 having the polishing pad 12 attached thereto to rotate at a rotational speed of 100 rpm as shown in FIG. 4. The rotational speed of the polishing head 13 was 103 rpm. By following the conventional supply method, Sample 1 constituting the slurry 25 was fed from the slurry supply nozzle 26 to a central region of the polishing pad 12. The flow rate of the slurry 25 was set to 100 cc/min. This flow rate corresponds to the ordinary flow rate of slurry which has been conventionally employed.

The slurry 25 applied dropwise to a central region of the polishing pad 12 spread toward the peripheral region of the polishing pad due to the centrifugal force, thereby the slurry 25 is utilized for the polishing of the thermal oxide film. The polishing pad employed herein was formed of IC1000 (Rodel Co., Ltd.). The polishing was performed for 60 seconds.

The thermal oxide film was polished under the same conditions as described above excepting that the flow rate of the slurry 25 to be fed from the slurry supply nozzle 26 was changed to 50 cc/min and to 25 cc/min. In this case, the polishing speed was estimated from the quantity shaved from the thermal oxide film. The flow rate of Sample 1 and the polishing speed are summarized in the following Table 2.

TABLE 2

| Flow rate (cc/min) | Polishing speed (nm/min) |
|---|---|
| 100 | 158 |
| 50 | 143 |
| 25 | 102 |

As shown in above Table 2, when the flow rate of slurry was 100 cc/min, the polishing speed was 158 nm/min, thus indicating that it was possible to polish the thermal oxide film at a practical speed. When the follow rate was decreased, the polishing speed was also decreased. When the follow rate was 25 cc/min, the polishing speed was decreased to 102 nm/min. Since the polishing speed of the thermal oxide film is at least required to be 150 nm/min or more, above-mentioned polishing speed is not practical.

Then, using the polishing foam generator 16 shown in FIG. 2, the samples Nos. 1-9 were respectively fed only to the region of the polishing pad 12 which corresponds to the orbital tract of the semiconductor substrate. In every case, the amount of the sample thus applied was 25 cc. The polishing of the same thermal oxide film as described above was performed under the same conditions excepting the quantity of the sample.

When the samples Nos. 2-9 were respectively feed as described above, the polishing foam 15 was placed at a predetermined region of the polishing pad 12 as shown in FIG. 1. The polishing foam 15 placed on the polishing pad 12 by each of samples of Nos. 4-9 was substantially incapable of exhibiting fluidity, thus enabling the polishing foam 15 to remain at the predetermined region of the polishing pad 12. It was assumed that the polishing foam 15 thus placed contributed to the polishing of the film throughout the entire period of polishing.

Figure 5:
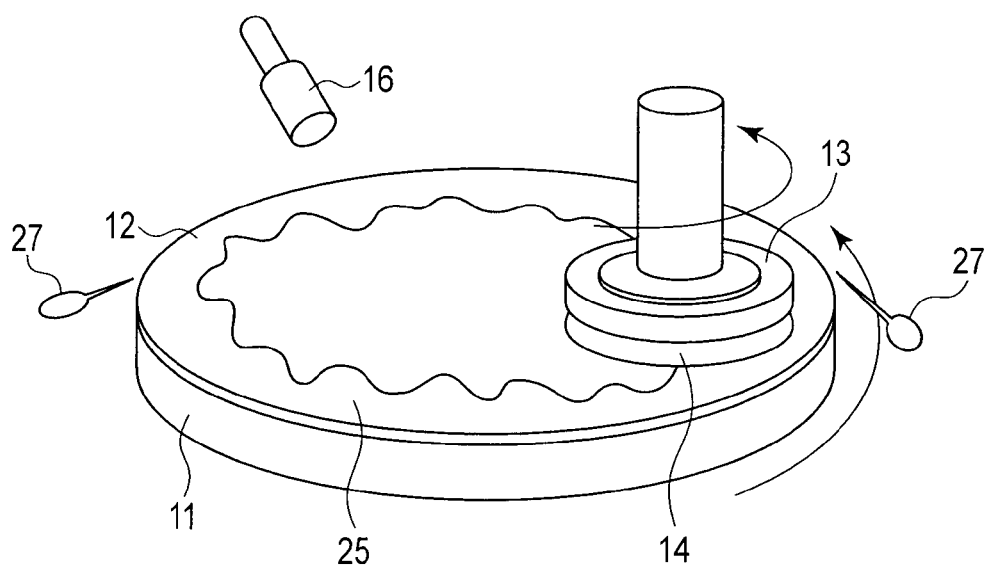
FIG. 5 is a perspective view schematically illustrating a conventional method of manufacturing a semiconductor device wherein a conventional slurry is used.

The polishing foam 15 created by each of samples of Nos. 2 and 3 was easily fluidized and hence was incapable of being stably kept in place. The sample of No. 1 was not foamy and a portion 27 thereof was discharged out of the polishing pad as shown in FIG. 5.

In the same manner as describe above, the polishing speed was estimated from the quantity shaved from the thermal oxide film. The polishing speed each of these samples is summarized in the following Table 3.

TABLE 3

| Sample No. | Polishing speed (nm/min) |
|---|---|
| 1 | 39 |
| 2 | 115 |
| 3 | 120 |

TABLE 3-continued

| Sample No. | Polishing speed (nm/min) |
|---|---|
| 4 | 169 |
| 5 | 161 |
| 6 | 157 |
| 7 | 153 |
| 8 | 135 |
| 9 | 166 |

Since Sample 1 was an aqueous dispersion, even if it was fed, using a polishing foam generator, to the region of the polishing pad which corresponds to the orbital tract of the semiconductor substrate, Sample 1 was incapable of being stably kept in place on the polishing pad. Since Sample 1 thus fed was discharged out of the polishing pad due to centrifugal force, the degree of Sample 1 that contributes to the polishing of the film was extremely minimized. Because of this, the polishing speed of the thermal oxide film was as very low as 39 nm/min. When slurry formed of an aqueous dispersion is employed, it is impossible to polish the film at the practical polishing speed unless the slurry is fed according to the conventional method.

In the cases of Samples 2 and 3, although they were respectively turned into a foamy body, the polishing speed thereof was as low as 120 nm/min or less, thus indicating insufficient polishing speed. The reason for this is assumed to be attributed to the fact that since the volume reduction ratio of these foamy bodies was too large, it was impossible to enable them to contribute to the polishing of the film to be polished.

The polishing speed in the cases of Samples 4-7 and 9 was all not less than the value that was obtained when the Sample 1 was supplied at a flow rate of 100 cc/min. Since the amount of feeding these samples was respectively 25 cc, it was possible to obtain a practical polishing speed even when the feeding amount of these samples was as small as ¼ of Sample 1.

In the case of Sample 8, although it was possible to keep the volume of foam, the polishing speed was as low as 135 nm/min. The reason for this was assumed to be attributed to the fact that since the content of the foam forming and retaining agent was as large as 15% by mass, the foam adhered to the film to be polished, thereby decreasing the polishing speed.

It was found out that when the method of this embodiment was adopted employing a polishing foam exhibiting a foam volume reduction ratio of 5% or less, it was possible to polish a film to be polished at a practical polishing speed even if the quantity of slurry to be used was reduced.

Embodiment 2

The method of manufacturing shallow trench isolation (STI) will be explained with reference to FIGS. 6A to 6C.

Figure 6A:
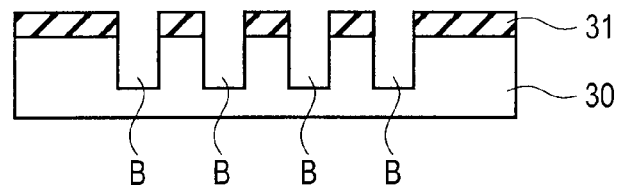
FIGS. 6A, 6B, and 6C are cross-sectional views illustrating the manufacturing process of STI.

First of all, a semiconductor substrate 30 having a silicon nitride film 31 deposited thereon and provided with an STI pattern B as shown in FIG. 6A was prepared. The silicon nitride film 31 acts as a stopper film and the film thickness thereof is 50 nm for example. A silicon oxide film for example may be interposed between the semiconductor substrate 30 and the silicon nitride film 31. Using the silicon oxide film as an etching mask, the semiconductor substrate 30 is worked together with the silicon nitride film 31 to form the STI pattern B.

The width and intervals of this STI pattern B are both 1 µm (line/space:1/1 µm). Further, the depth of this STI pattern B is 200 nm for example.

Figure 6B:
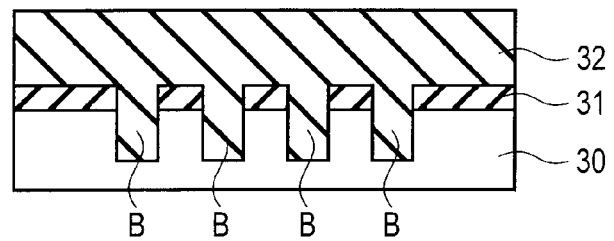

As shown in FIG. 6B, a silicon oxide film 32 is deposited on the silicon nitride film 31 by a high-density plasma CVD (HDP-CVD) method for example. The film thickness of the silicon oxide film 32 is 280 nm and this silicon oxide film 32 is formed all over the surface of silicon nitride film 31 including the regions other than the STI pattern B.

Figure 6C:
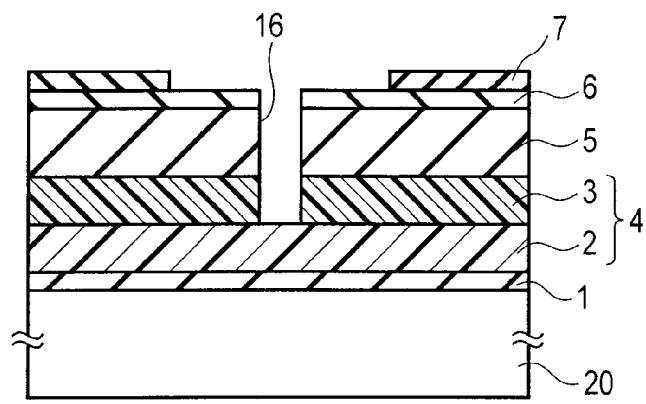

Then, the surface of silicon oxide film 32 is entirely subjected to CMP to remove the silicon oxide film 32 existing outside the STI pattern B as shown in FIG. 6C. As a result, the silicon oxide film 32 is buried in the STI pattern B and the surface of silicon nitride film 31 is exposed at the regions other than the STI pattern B.

On the occasion of performing the CMP, the silicon oxide film is polished at first under the conditions conventionally employed. More specifically, the aforementioned Sample 1 is fed at a flow rate of 100 cc/min and the polishing is performed under the same conditions as described above. The polishing speed is 158 nm/min.

Further, using aforementioned Sample 5, the silicon oxide film is polished under the same conditions as described above. Namely, using a polishing foam generator, 25 cc of Sample 5 is turned into a foamy body, which is then applied only to the region of polishing pad corresponding to the orbital tract of the semiconductor substrate. The polishing speed is 161 nm/min.

The time required for exposing the surface of silicon nitride film 31, the depth of dishing on the surface of silicon oxide film 32 that was left remain in the STI pattern B and the number of defectives were investigated, the results being summarized in the following Table 4. If the depth of dishing is not more than 30 nm, it is considered as acceptable.

TABLE 4

| Sample No. | Polishing time (sec) | Dishing (nm) | Number of defectives |
|---|---|---|---|
| 1 | 95 | 15 | 23 |
| 5 | 92 | 18 | 20 |

Above Table 4 indicates that, as in the case of Embodiment 1, even if the quantity of slurry used was reduced to ¼ of Sample 1, it was possible to obtain almost the same CMP performance.

Embodiment 3

Silicon oxide having an average particle diameter of 25 nm is prepared as abrasive grain. This silicon oxide is added to pure water employed as a solvent to obtain an aqueous dispersion containing 10% by mass of silicon oxide. The aqueous dispersion thus obtained is used as Sample 10. This Sample 10 corresponds to a CMP slurry which has been conventionally used.

To this Sample 10 is added predetermined amount of ammonium linear dodecylbenzenesulfonate as a foam forming and retaining agent to obtain Sample 11 as polishing foam. The foam volume reduction ratio of this Sample 11 after standing for 120 seconds at room temperature is 4%.

In the employment of Sample 10, the polishing of a silicon oxide film is performed under the same conventional conditions as described in Embodiment 1. More specifically, Sample 10 is fed at a flow rate of 10 cc/min and the polishing was performed under the same conditions as described above. The polishing speed is 108 nm/min.

On the other hand, in the employment of Sample 11, cc of Sample 5 is turned into a foamy body using a polishing foam generator and then applied only to the region of polishing pad corresponding to the orbital tract of the semiconductor substrate. The polishing speed is 121 nm/min.

When compared with cerium oxide, although the polishing speed to be obtained using silicon oxide was decreased, the polishing speed was not lowered even if the flow rate thereof was reduced to ¼. It was confirmed that even if silicon oxide was employed as abrasive grain, it was possible to obtain almost the same effects as in the case of cerium oxide.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    contacting a film formed on a semiconductor substrate with a rotating polishing pad which is supported on a turntable; and
    feeding polishing foam to a region of the polishing pad with which the film is contacted, thereby polishing the film, the polishing foam being obtained by turning an aqueous dispersion into a foamy body, the aqueous dispersion comprising 0.01-20% by mass of abrasive grain and 0.01-1% by mass of foam forming and retaining agent, all based on a total amount of the aqueous dispersion.

2. The method according to claim 1, wherein the polishing foam exhibits a volume reduction ratio of 5% or less as measured after the foam is kept standing for 120 seconds at room temperature.

3. The method according to claim 1, wherein the polishing foam exhibits a volume reduction ratio of 1% or less as measured after the foam is kept standing for 120 seconds at room temperature.

4. The method according to claim 1, wherein the foam forming and retaining agent is selected from the group consisting of linear alkylbenzenesulfonic acid, potassium linear alkylbenzenesulfonate and ammonium linear alkylbenzenesulfonate.

5. The method according to claim 4, wherein the foam forming and retaining agent has 8 to 16 carbon atoms in the alkyl group.

6. The method according to claim 5, wherein the alkyl group comprises 10 to 14 carbon atoms.

7. The method according to claim 1, wherein an amount of the foam forming and retaining agent is 0.5-5% by mass based on the total amount of the aqueous dispersion.

8. The method according to claim 1, wherein the abrasive grain is selected from the group consisting of cerium oxide and silicon oxide.

9. The method according to claim 1, wherein an amount of the abrasive grain is 0.1-1% by mass based on the total amount of the aqueous dispersion.

10. The method according to claim 1, wherein an average particle diameter of the abrasive grain is 10-1000 nm.

11. The method according to claim 1, wherein the film to be polished is an oxide film.

12. The method according to claim 1, wherein the aqueous dispersion is turned into a foamy body at a temperature of 18-30° C.

13. The method according to claim 1, wherein the polishing pad is rotated at a speed of 10-150 rpm.

14. The method according to claim 1, wherein the polishing foam is formed by feeding air having a volume 2-10 times as large as that of the aqueous dispersion.

15. The method according to claim 1, wherein the aqueous dispersion further comprises resinous particle having an anionic functional group on its surface.

16. The method according to claim 15, wherein the resinous particle is formed of a material selected from polystyrene and polymethacrylate.

17. The method according to claim 15, wherein the anionic functional group is selected from carboxyl group and sulfonyl group.

18. The method according to claim 1, wherein an aperture of the mesh is 100-500 meshes.

* * * * *